United States Patent
Lindqvist et al.

(10) Patent No.: US 9,470,729 B2
(45) Date of Patent: Oct. 18, 2016

(54) TRANSMISSION LINE PARAMETER DETERMINATION

(75) Inventors: Fredrik Lindqvist, Järfälla (SE); Per Ola Börjesson, Lund (SE); Antoni Fertner, Stockholm (SE)

(73) Assignee: TELEFONAKTIEBOLAGET L M ERICSSON, Stockholm (SE)

( * ) Notice: Subject to any disclaimer, the term of this patent is extended or adjusted under 35 U.S.C. 154(b) by 483 days.

(21) Appl. No.: 14/110,215

(22) PCT Filed: Apr. 8, 2011

(86) PCT No.: PCT/SE2011/050430
§ 371 (c)(1),
(2), (4) Date: Oct. 9, 2013

(87) PCT Pub. No.: WO2012/138271
PCT Pub. Date: Oct. 11, 2012

(65) Prior Publication Data
US 2014/0025327 A1    Jan. 23, 2014

(51) Int. Cl.
*G01R 27/02* (2006.01)
*H04B 3/466* (2015.01)

(52) U.S. Cl.
CPC ............ *G01R 27/02* (2013.01); *H04B 3/466* (2013.01)

(58) Field of Classification Search
CPC ................................ G01R 27/02; H04B 3/466
USPC ........... 702/57, 64.65, 69, 74; 324/534, 624; 375/224; 379/31
See application file for complete search history.

(56) References Cited

U.S. PATENT DOCUMENTS

| | | | |
|---|---|---|---|
| 6,263,047 B1 | 7/2001 | Randle et al. | |
| 7,511,508 B2* | 3/2009 | Haruta | G01R 27/28 324/538 |
| 2002/0186760 A1 | 12/2002 | Bostoen et al. | |

(Continued)

OTHER PUBLICATIONS

Norgen, M., et al., "An Optimization Approach to the Frequency-Domain Inverse Problem for a Nonuniform LCRG Transmission Line", IEEE Transactions on Microwave Theory and Techniques, Aug. 1, 1996, pp. 1503-1507, vol. 44, No. 8, IEEE.

(Continued)

*Primary Examiner* — John H Le
(74) *Attorney, Agent, or Firm* — Patents on Demand P.A.; Brian K. Buchheit; Scott M. Garrett

(57) ABSTRACT

The present disclosure relates to determining parameters in a model of a transmission line. For determining the parameters, reflection coefficient defining data and the total capacitance of the transmission line are obtained. Further, true reflection coefficients obtained through the reflection coefficient defining data are applied in an objective function for the line. The objective function for the line is a sum of error signals and each error signal is the difference between a model value of a reflection coefficient and a corresponding true reflection coefficient. Further, the objective function is minimized by utilizing gradients of the objective function with respect to the transmission line parameters to be determined. A capacitive length is employed and at least two further transmission line parameters are determined as combinations of a basic resistive transmission line parameter, a basic capacitive transmission line parameter and a basic inductive transmission line parameter of the transmission line model.

22 Claims, 5 Drawing Sheets

(56) References Cited

U.S. PATENT DOCUMENTS

2004/0080323 A1 4/2004 Bostoen et al.
2004/0261045 A1 12/2004 Dahlen et al.

OTHER PUBLICATIONS

Lindqvist, F., et al., "Low-Order and Causal Twisted-Pair Cable Modeling by Means of the Hilbert Transform", 20th Nordic Conference on Radio Science and Communications. AIP Conference Proceedings, AIP Conference Proceedings, Jun. 9, 2008, pp. 301-310, vol. 1106, Issue 1.

Telecommunication Standardization Sector of ITU, "Test procedures for digital subscriber line (DSL) transceivers", Series G: Transmission Systems and Media, Digital Systems and Networks, Digital sections and digital line system Access Networks, G.996.1, Feb. 1, 2001, pp. 1-86, ITU.

Höst, S. et al., "Low Complexity Computation of the BT0 Hilbert Twisted Pair Cable Model", 15th International OFDM-Workshop 2010, Sep. 1, 2010, pp. 195-199, IEEE.

* cited by examiner

TRANSMISSION LINE PARAMETER DETERMINATION

TECHNICAL FIELD

The invention relates to the investigating of properties of transmission lines. More particularly, the invention relates to a method, device and computer program product for determining parameters in a model of a transmission line.

BACKGROUND

Modems like Digital Subscriber Line (DSL) modems are normally connected to a device for providing access to a data communication network. Such a device is typically a Digital Subscriber Line Access Multiplexer (DSLAM) and the communication network may be the Internet. One particular type of standard that may be used is Very-high-speed Digital Subscriber Line 2 (VDSL2).

When being connected in this way the modems are connected to the device via separate transmission lines, typically conductor pairs made of copper. These transmission lines are furthermore often standard telephone lines, often denoted Plain Old Telephone Service) POTS lines and typically made of twisted copper pairs.

The properties of these transmission lines are normally not known beforehand, especially with regard to data communication, but may be obtained through applying line measurements of these transmission lines.

One way of obtaining measurements is through Single-ended line testing (SELT), which is a cost-effective technique which DSL operators utilize since it requires only measurements from one end of the copper line. This is made possible in practice by using pre-existing equipment as e.g. POTS line cards and/or DSL modems. Typical measurements may include the total line capacitance at DC (zero frequency), the line input impedance, and the reflection coefficient (i.e. scattering parameter $S_{11}$).

The measurements may then be used in determining transmission line parameters. Several kinds of line parameters may here be of interest, for instance, line resistance, inductance and capacitance.

One property of the transmission line that is of interest is the capacity to transfer data. The capacity may be obtained through determining the maximum number of bits the line can support for a given error rate. The capacity can be estimated from the frequency dependent transfer function of the line (i.e. line attenuation) and the total noise (i.e. thermal plus crosstalk noise). The total line noise typically changes over time but can often be directly measured or assumed to comply with some crosstalk scenario. The transfer function, however, can be considered time invariant and needs to be estimated only once or seldom.

This transfer function is however normally not known and may therefore have to be obtained through some of the above mentioned transmission line parameters.

There is therefore a need for determining transmission line parameters.

One approach for determining of transmission line parameters in the field of microwave transmission is described by Martin Norgren and Sailing He in "An optimization approach to the frequency-domain inverse problem for a nonuniform LCRG transmission line", IEEE Transactions on microwave theory and techniques, vol. 44, No. 8, August 1996.

Here parameters are determined based on knowledge of the length of the transmission line where the meaning of transmission line in the microwave application refers to e.g. a microstrip or a filter with a physical extension fraction of a meter. This length is in many cases, and typically in the case of POTS/DSL lines, unknown and hard to determine accurately. For the POTS/DSL line case, this length is in the order of tens of meters up to several hundreds of meters, and therefore differs significantly from the transmission medium used for microwave applications.

There is therefore a need for determining transmission line parameters without having to consider the length of the transmission line.

The present invention is directed towards solving this problem.

SUMMARY

The invention is therefore directed towards determining parameters of a transmission line without needing to know the length of the transmission line.

One object of the invention is thus to provide a method for determining parameters of a transmission line, which method does not have to use the length of the transmission line.

This object is according to a first aspect of the invention achieved through a method for determining parameters in a model of a transmission line, where the method comprises:
obtaining measurements of the line comprising reflection coefficient defining data and the total line capacitance,
applying true reflection coefficients in an objective function J(p) for the line, where the true reflection coefficients have been obtained through the reflection coefficient defining data and the objective function comprises a sum of error signals, where each error signal comprises the difference between a model value of a reflection coefficient and a corresponding true reflection coefficient,
minimising the objective function by utilizing gradients of the objective function with respect to the transmission line parameters to be determined and employing a capacitive length y(x), and
determining at least two further transmission line parameters as combinations of basic transmission line parameters in the transmission line model. The basic transmission line parameters comprise a basic resistive transmission line parameter $R_\nu(y)$, a basic capacitive transmission line parameter $C_\infty(y)$ and a basic inductive transmission line parameter $L_\infty(y)$.

Another object of the invention is to provide a device for determining parameters of a transmission line, which device does not have to use the length of the transmission line.

This object is according to the same aspect achieved by a device determining parameters in a model of a transmission line. The device is equipped with a parameter determining module that comprises:
a measurement obtaining unit configured to obtain measurements of the line at least comprising reflection coefficient defining data and the total line capacitance y(d),
an objective function handling unit configured to apply true reflection coefficients $r_t(w)$ obtained through the reflection coefficient defining data in an objective function J(p) for the line, where the objective function comprises a sum of error signals and each error signal comprises the difference between a model value $r_m(0, w)$ of a reflection coefficient and a corresponding true reflection coefficient $r_t(w)$, and
a minimising unit configured to minimise the objective function by utilising gradients of the objective function with regard to the model parameters to be determined and employing a capacitive length y(x), and a parameter determining unit configured to determine at least two further transmission line parameters $p_1(y)$, $p_2(y)$ as combinations of basic transmission line parameters in the transmission line model. The basic transmission line parameters comprise a basic resistive transmission line parameter $R_v(y)$, a basic capacitive transmission line parameter $C_\infty(y)$ and a basic inductive transmission line parameter $L_\infty(y)$.

Another object is to provide a computer program product for determining parameters of a transmission line, which computer program product does not have to use the length of the transmission line in these determinations.

This object is according to the same aspect of the invention also achieved through a computer program product for determining parameters in a model of a transmission line. The computer program product comprises a computer readable storage medium comprising a set of instructions causing a parameter determining module of a parameter determining device to obtain measurements of the line at least comprising reflection coefficient defining data and the total line capacitance $y(d)$,
apply true reflection coefficients $r_t(w)$ obtained through the reflection coefficient defining data in an objective function $J(p)$ for the line, where the objective function comprises a sum of error signals and each error signal comprises the difference between a model value $r_m(0, w)$ of a reflection coefficient and a corresponding true reflection coefficient $r_t(w)$,
minimise the objective function by utilizing gradients of the objective function with respect to the model parameters to be determined and employing a capacitive length $y(x)$, and determine at least two transmission line parameters $p_1(y)$, $p_2(y)$ as combinations of basic transmission line parameters in the transmission line model, said basic transmission line parameters comprising a basic resistive transmission line parameter $R_v(y)$, a basic capacitive transmission line parameter $C_\infty(y)$ and a basic inductive transmission line parameter $L_\infty(y)$.

The capacitive length may here be the basic capacitive transmission line parameter integrated along a spatial dimension of the transmission line.

The invention according to the first aspect has a number of advantages. It does not require any knowledge of the physical length of the transmission line, which may otherwise be difficult to obtain. The capacitive length can be practically measured by using existing equipment and/or methods. Through the use of the capacitive length the number of parameters in the optimization problem is furthermore reduced. This reduces the amount of computations needed and thus the processing effort. It also reduces the risk of finding a local optimum.

According to a second aspect of the invention, the method further comprises estimating the model value $r_m(w)$ of the reflection coefficient using a differential equation that is based on the basic transmission line parameters such as primary transmission line parameters.

According to the same aspect the parameter determining module of the device further comprises a reflection coefficient estimating unit configured to estimate the model value $r_m(w)$ of the reflection coefficient using a differential equation that is based on the transmission line parameters.

In this differential equation it is furthermore possible that the total line capacitance is part of a boundary condition.

A first further transmission line parameter $p_1(y)$ may according to a third aspect of the invention be the basic resistive parameter divided by the basic capacitive parameter and a second further transmission line parameter $p_2(y)$ may be the basic inductive parameter divided by the basic capacitive parameter.

According to a fourth aspect of the invention the reflection coefficient defining data comprises the true reflection coefficients and according to a fifth aspect of the invention the reflection coefficient defining data comprises impedance measurements $Z_{in}(w)$.

In this latter aspect the method further comprises determining the true reflection coefficients based on the impedance measurements and the measurement obtaining unit of the parameter determining module of the device is further configured to determine the true reflection coefficients based on the impedance measurements.

In a sixth aspect of the invention the transmission line model is a low-frequency model valid for a wider bandwidth including the lower frequencies, while in a seventh aspect of the invention it is a first high-frequency transmission line model M1 with associated basic transmission line parameters $R_v(y)$, $C_\infty(y)$, and $L_\infty(y)$.

In the latter aspect, the method may further comprise calculating gradients of the minimized objective function with respect to further parameters of a second low-frequency transmission line model M2, and determining at least three further transmission line parameters $\tilde{p}_1(y)$, $\tilde{p}_2(y)$, $\tilde{p}_3(y)$ as combinations of resistive basic transmission line parameters $R_0(y)$ and $v(y)$, a capacitive basic transmission line parameter $C_\infty(y)$ and an inductive basic transmission line parameter $L_\infty(y)$ of the second transmission line model, where at least one of the transmission line parameters $\tilde{p}_3(y)$ can be derived from one of transmission line parameters $p_2(y)$ obtained via the first transmission line model.

In the latter aspect the minimising unit of the parameter determining module of the device may be further configured to calculate gradients of the minimized objective function with respect to further parameters of a second low-frequency transmission line model M2 and the parameter determining unit is configured to determine at least three further transmission line parameters $\tilde{p}_1(y)$, $\tilde{p}_2(y)$, $\tilde{p}_3(y)$ as combinations of resistive basic transmission line parameters $R_0(y)$ and $v(y)$, a capacitive basic transmission line parameter $C_\infty(y)$ and an inductive basic transmission line parameter $L_\infty(y)$ of the second transmission line model, where at least one of the transmission line parameters $\tilde{p}_3(y)$ can be derived from one of transmission line parameters $p_2(y)$ obtained via the first transmission line model.

The second further transmission line parameter obtained via the first model may according to an eighth aspect of the invention be used as a fixed value of one of the further transmission line parameters obtained via the second model and may according to a ninth aspect of the invention be used as a start value for obtaining one of the further transmission line parameters in the second model.

The gradients may comprise analytical gradients. However, they may also comprise numerical gradients.

It is furthermore possible that the transmission line is considered to be an open ended line in the calculations.

According to a further aspect of the invention, the transmission line parameters are determined as discrete values $p_i(a)$, $p_i(b)$, $p_i(c)$, $p_i(d)$ at equidistant points in a spatial dimension of the line.

The method will then according to this aspect further comprise interconnecting the points using an interconnecting scheme.

The parameter determining unit may according to the same aspect be further configured to interconnect the points using an interconnecting scheme.

The interconnecting scheme may employ a number of interconnecting techniques. It may for instance use partial linear interpolation, piecewise-constant spatial modelling and spatial linear interpolation or spatial modelling with an orthogonal/orthonormal basis function. In the latter case it is possible that the spatial modelling comprises using analytical gradients associated with the orthogonal/orthonormal basis function.

According to yet another aspect of the invention, the method further comprises determining the transmission capacity of the transmission line based on the transmission line parameters.

According to the same aspect, the parameter determining module of the device may further comprise a capacity determining unit configured to determine the transmission capacity of the transmission line based on the transmission line parameters.

It should be emphasized that the term "comprises/comprising" when used in this specification is taken to specify the presence of stated features, integers, steps or components, but does not preclude the presence or addition of one or more other features, integers, steps, components or groups thereof.

BRIEF DESCRIPTION OF THE DRAWINGS

The invention will now be described in more detail in relation to the enclosed drawings, in which.

DETAILED DESCRIPTION

In the following description, for purposes of explanation and not limitation, specific details are set forth such as particular architectures, interfaces, techniques, etc. in order to provide a thorough understanding of the invention. However, it will be apparent to those skilled in the art that the invention may be practiced in other embodiments that depart from these specific details. In other instances, detailed descriptions of well-known devices, circuits, and methods are omitted so as not to obscure the description of the invention with unnecessary detail.

The invention concerns the determining of parameters of a transmission line for typical use with modems or telephony. The invention will in the following be described in relation to a device providing access to the Internet for Digital Subscriber Line (DSL) modems. More particularly, the device will in the following be described in relation to a Digital Subscriber Line Access Multiplexer (DSLAM). However, the invention is in no way limited to a DSLAM, but may be provided in any type of device that has access to transmission line measurements and has the ability to determine transmission line parameters. For this reason it should also be realized that the device can be another type of device than a DSLAM.

Figure 1:
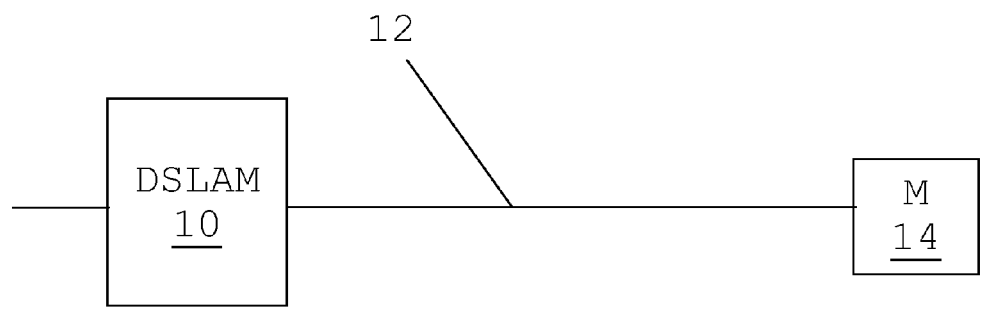
FIG. 1 schematically shows a modem connected to a device for determining the parameters in a model of a transmission line.

FIG. 1 schematically shows a device 10 for determining the transfer function parameters of a transmission line, i.e. a parameter determining device. This parameter determining device 10 may be provided as a part of a device providing access to a data communication network (not shown) in the form of a DSLAM and being connected to a number of modems. The device 10 is here shown as being connected to one end of a transmission line 12 and a modem 14 is connected to an opposite end of the transmission line. The transmission line 12, which may be a Plain Old Telephone Service (POTS) transmission line may be a conductor pair made of copper and may furthermore be provided together with other transmission lines in a cable. As mentioned above several modems may be connected to the DSLAM 10, each via a corresponding communication line. However, only one 14 is shown here in order to provide a clearer description of the invention.

Figure 2:
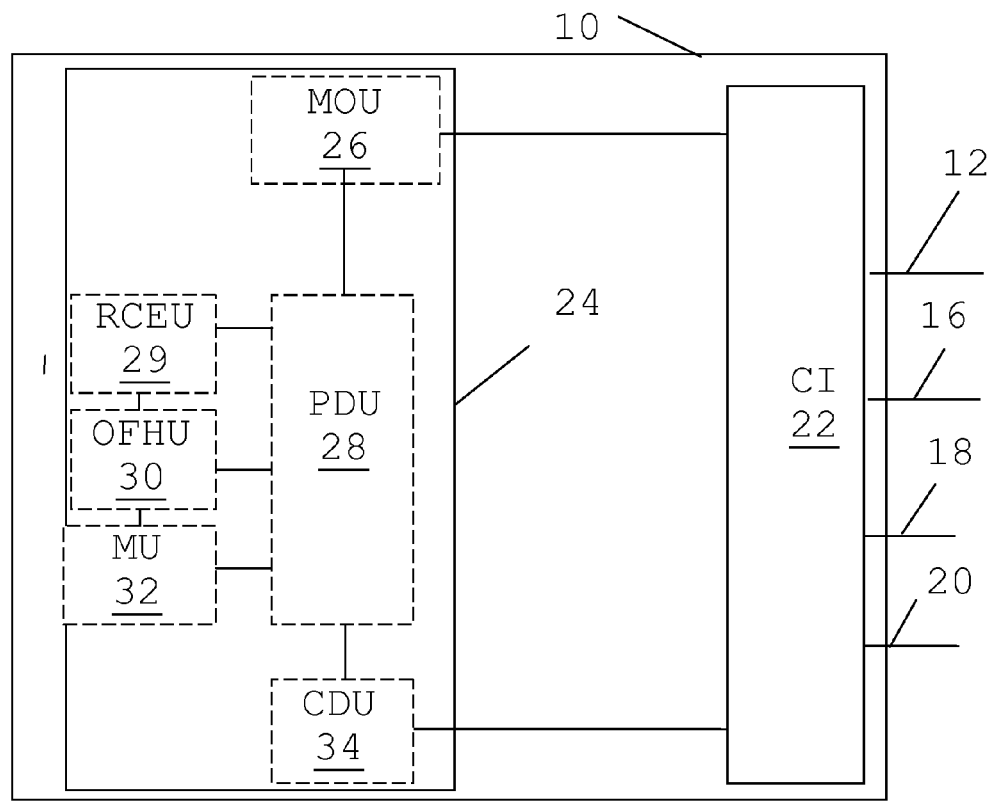
FIG. 2 shows a simplified block schematic of the device in FIG. 1.

A block schematic of some units of the DSLAM 10 that are provided for performing the activities of the invention are shown in FIG. 2. The DSLAM comprises a parameter determining module 24, which comprises a measurement obtaining unit MOU 26, a parameter determining unit 28, a reflection coefficient estimating unit RCEU 29, an objective function handling unit OFHU 30, a minimising unit MU 32 and a capacity determining unit 34. The DSLAM 10 also comprises a communication interface CI 22. Here the measurement obtaining unit 26 is connected to the communication interface 22 as well as to the parameter determining unit 28. The parameter determining unit 28 is also connected to the reflection coefficient estimating unit 29, the objective function handling unit 30, the minimising unit 32 and the capacity determining unit 34. The reflection coefficient estimating unit 29 is also connected to the objection function handling unit 30, which objection function handling unit 30 is in turn connected to the minimising unit 32. The capacity determining unit 34 is also connected to the communication interface 22.

The communication interface 22 is in turn connected to a number of transmission lines 12, 16, 18 and 20 leading to various modems.

The present invention is concerned with determining unknown transmission line parameters. These are furthermore determined based on one-port measurements of the transmission line.

To determine unknown transmission line parameters based on a known one-port measurement, i.e., based on single-ended line testing (SELT), is referred to in the Microwave (Scattering) literature as solving the inverse problem. The direct problem, which is the opposite, corresponds to determining of the unknown one-port measurements from known transmission line parameters.

Figure 3:
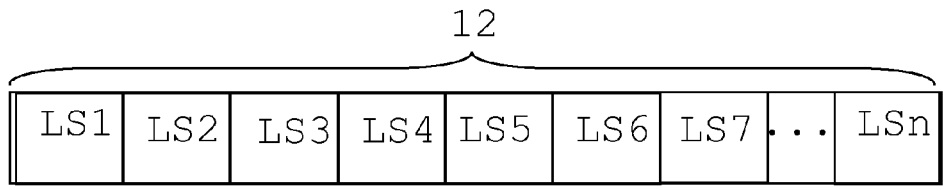
FIG. 3 shows how a transmission line is considered as a number of sections in a model of the transmission line.

The transmission line 12 can be represented as a cascade of infinitesimal homogenous line sections, see FIG. 3.

The line can thus be considered to be made up of n line sections LS1, LS2, LS3, LS4, LS5, LS6, LS7, . . . , LSn connected in cascade.

Figure 4:
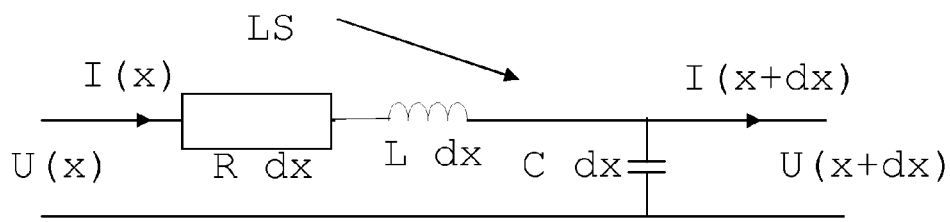
FIG. 4 shows the contents of a section in FIG. 3.

Furthermore each such section may be considered to have the structure as shown in FIG. 4. A section LS has an input port connected to an output port via a resistance R dx in series with an inductance L dx. In parallel with the output port there is a capacitance C dx. Here there is an input voltage U(x) at the input port and an input current I(x) running from the input port through the resistance R dx and capacitance C dx. There is also an output current I(x+dx) leaving the output port from the junction between the capacitance C dx and the inductance L dx as well as an output voltage u(x+dx) at the output port. x here indicates the variable distance along the line.

According to this model there is also normally a line conductance G dx in parallel with the capacitance C dx. This has here been omitted, because the conductance can normally be neglected in telecommunication cables, i.e. assumed to be zero.

The so-called primary parameters R, L and C that are obtained through the totality of line sections are often presumed constant with respect to line length but dependent on frequency. If the conductance G is omitted then it is possible to obtain the secondary parameters from the primary parameters as:

$$\gamma = \sqrt{(R + jwL)jwC} \quad (1)$$

$$Z_0 = \sqrt{\frac{R + jwL}{jwC}}$$

where $w=2\pi f$ is the angular frequency, $\gamma=\alpha+\beta$ is the complex-valued propagation constant and $Z_0$ is the characteristic impedance. The characteristic impedance is typically a property than can be measured. Here $\alpha$ furthermore denotes the attenuation constant and $\beta$ the phase delay. Under the assumption of a perfectly matched source and load impedance, it is possible to obtain a transfer function as $$H=e^{-\gamma d}, \quad (2)$$

where d is the length of the line.

In practice the transmission line parameters are varying somewhat with respect to line length, i.e., the line is non-uniform. If the line is made up of multiple cable types spliced together, a rapid parameter change in the spatial dimension typically occurs. It is therefore appropriate to introduce the notation R(x, w), L(x, w) and C(x, w) to emphasize both the spatial and frequency dependence, respectively.

Another important parameter is the reflection coefficient of the line.

The reflection coefficient i.e. the scattering parameter $S_{11}$, may be defined as:

$$r(0, w) = \frac{Z_{in} - Z_S}{Z_{in} + Z_S} \quad (3)$$

where $Z_S$ denotes the (known) source impedance and $Z_{in}$ is the line input impedance.

Figure 5:
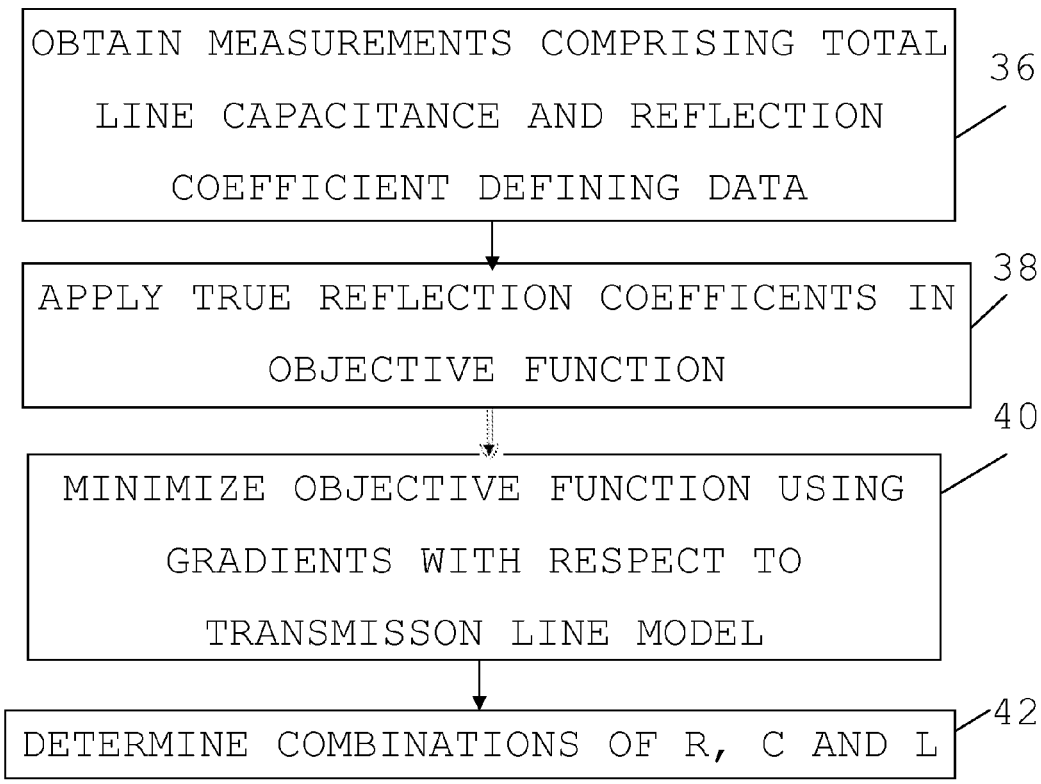
FIG. 5 shows a flow chart of a method for determining the parameters in a model of a transmission line according to a first embodiment of the invention.

The general functioning of the present invention will now be described with reference also being made to FIG. 5, which shows a flow chart of a first method of the invention being performed in the device.

According to the first embodiment of the invention, the measurement obtaining unit 26 obtains measurements of the line comprising total line capacitance and reflection coefficient defining data, step 36. The reflection coefficient determining data may here be measured reflection coefficients, which are considered the true reflection coefficients. As an alternative it is possible that the reflection coefficient determining data are impedance measurements $Z_{in}(w)$, from which true reflection coefficients are calculated for instance by the measurement obtaining unit 26.

The true reflection coefficient is applied by the objective function handling unit 30 in an objective function, step 38. This objective function is a function that is based on differences between a model of the reflection coefficient and the true reflection coefficient at various frequencies to be covered. The objective function is thus made up of a number of error signals, each comprising a difference between a model reflection coefficient and a true reflection coefficient. Each error signal may here furthermore be made up of the difference between a model coefficient and a true coefficient at a certain frequency.

The objective function may typically be a sum of such error signals and these error signals may also be raised with a power of n, where n may be 2. It should however be realized that also other powers are possible. Here the model of the reflection coefficient may be estimated, by the reflection coefficient estimating unit 29 through the use of a differential equation involving basic parameters of the transmission line model, where the basic model parameters may comprise the resistance or spatial dependent resistance R, the capacitance or spatial dependent capacitance C and the inductance or spatial dependent inductance L.

Thereafter the minimising unit 32 minimises the objective function by using gradients of the objective function with regard to a number of further parameters in a transmission line model, step 40. The gradients may here with advantage be analytical gradients. However it is also possible with multi-objective minimisations via numerical gradients. In theses minimisations and in the solving of the direct problem a capacitive length is employed, which is the capacitance integrated along a spatial dimension of the transmission line and typically integrated along the whole length. Here the total line capacitance is also a part of the boundary condition of the differential equation.

Minimisations are iteratively repeated until the desirable parameters are obtained with a sufficient accuracy. Thus after these minimisations, the parameter determining unit 32 determines the sought parameters, which may be combinations of the above mentioned spatial dependent parameters R, C and L, step 42. These may then be used in determining a number of interesting properties of the transmission line like capacity in the form of bit rate.

Through the use of the capacitive length it is possible to obtain parameters without relying on the often unknown transmission line length, which greatly simplifies the obtaining of parameters.

Now that the general operation has been described, some more details concerning different aspects of the invention will be given.

The invention is based on the optimisation approach suggested by M. Norgren and S. He in "An optimization approach to the frequency-domain inverse problem for a nonuniform LCRG transmission line", IEEE Transactions on microwave theory and techniques, vol. 44, No. 8, August 1996, which document is herein incorporated by reference.

This reference is related to the microwave area and therefore not directly applicable to the frequency range used in the DSL area. Furthermore in the microwave field the line length, i.e., the physical extension of the transmission medium or filter, is usually known and used, something that is not possible when POTS/DSL lines are considered. There is therefore a need for modifications and reformulation of this general optimisation approach.

According to the invention an objective function is selected and this function is a function that is based on the reflection coefficient. It should here be realised that the objective function could additionally or instead be based on the transmission coefficient.

As mentioned earlier, the objective function is made up of a number of error signals, each comprising a difference between a model reflection coefficient and a true reflection coefficient. The objective function is in some embodiments of the invention a sum of such error signals and these differences may also be raised with a power of n.

In some of the embodiments of the invention the objective function to be minimised is defined by $$J(p) = \sum_{w=w_{min}}^{w_{max}} \omega_r(w)|r_m(0, w) - r_t(w)|^2, \qquad (4)$$

where $r_m(0, w)$ denotes the model for the reflection coefficient evaluated at x=0, which constitutes the left connection point of the transmission line, i.e. the connection point of the DSLAM, $r_t(w)$ is the measured physical, i.e. true, reflection coefficient, $\omega_r(w)$ is a weight function that is design optional, whose purpose is to weight down/up certain frequencies, $w_{min}$ and $w_{max}$ are the lower and upper frequencies of the frequency range used and p is a parameter vector.

In general, the objective function may also include the transmission coefficient t and/or the right-side reflection coefficient as described in equation (12) by Norgren et al. However, in a Single-ended line tested SELT application this transmission coefficient t is of less interest and may be omitted.

In case the transfer coefficient would be used equation (4) may be changed into:

$$J(p) = \sum_{w=w_{min}}^{w_{max}} \omega_r(w)|r_m(0, w) - r_t(w)|^2 + \omega_t(w)|t_m(0, w) - t_t(w)|^2 \qquad (5)$$

where $t_m(0, w)$ denotes the model for the transmission coefficient evaluated at x=0, $t_t(w)$ is the measured physical, i.e. true, transmission coefficient and $\omega_t(w)$ is a weight function.

For notational simplicity the explicit dependence of p has been omitted from the objective function, but there is in fact such a dependence in the model $r_m(0, w)$ of the reflection coefficient. The parameter vector p is denoted by $p=[p_1, p_2, \ldots, p_Q]^T$ containing Q parameters that are functions of the spatial variable x, here the length of the transmission line. Hence a more complete notation would be $p=[p_1(x), p_2(x), \ldots, p_Q(x)]^T$. The weight function $\omega_r(w)$ is typically some form of low-pass function used to de-emphasize higher frequencies since these typically contain more measurement noise and numerical errors.

The value of $r_m(0, w)$ in equation (4) can be calculated by solving the direct problem. This means that for a given parameter vector p the model $r_m(x, w)$ is determined by solving a differential equation for the model of the reflection coefficient based on the transmission line parameters and here the Riccati differential equation $$\frac{d}{dx}r_m(x, w) = 2a(x, w)r_m(x, w) + b(x, w)(1 + r_m(x, w)^2) \qquad (6)$$

with the boundary condition $$r(d, w) = \frac{Z_L - Z_0}{Z_L + Z_0} \qquad (7)$$

where d is the line length, $Z_L$ denotes the line termination impedance, $Z_S$ is the source impedance, and where a(x, w) and b(x, w) are defined as $$a(x, w) = \frac{1}{2}[jw(C(x, w)Z_S + L(x, w)Z_S^{-1}) + (G(x, w)Z_S + R(x, w)Z_S^{-1})] \qquad (8)$$

$$b(x, w) = \frac{1}{2}[jw(C(x, w)Z_S - L(x, w)Z_S^{-1}) + (G(x, w)Z_S - R(x, w)Z_S^{-1})]$$

More details of how these are obtained is described by Norgren et al. Here it should also be mentioned that one may also choose $Z_S$ equal to $Z_0$.

Without much loss of generality it is possible to assume an open-ended line that provides a boundary condition r(d, w)=1.

Norgren et al. described the use of four parameters in a vector $p=[R_v, L_\infty, C_\infty, G_0]^T$ and where $$R(x,w)=(1+j)R_v(x)\sqrt{w}$$

$$L(x,w)=jwL_\infty(x)$$

$$C(x,w)=C_\infty(x)$$

$$G(x,w)=G_0(x) \qquad (9)$$

Note that parameter $R_v(x)$ corresponds to the parameter Q(x) used by Norgren in his equation (30) but has here been renamed due to conflicting variable names. Note also that the subscript $\infty$ has been added to comply with the notation that is conventional in DSL field, see for instance ITU-T Recommendation G.996.1, "Test procedures for digital subscriber line (DSL) transceivers".

As previously described it is assumed that G may be neglected and therefore $p=[R_v(x), L_\infty(x), C_\infty(x)]^T$ would be the vector. The parameters $R_v(x)$, $L_\infty(x)$, $C_\infty(x)$ and $G_0$ defined in equation (9) are here termed basic transmission line parameters and as can be seen show a dependence on the primary transmission line parameters.

In general one can not analytically solve the inverse problem since the objective function has nonlinear dependence on the unknown line parameters. Therefore, the minimization of equation (4) by Norgren et al. is conducted by means of gradient based optimization that iteratively tries to find the global minimum. The success of such optimization depends on the shape of the objective function, i.e. if it is convex or not, and how close the start values are to the optimum. It is worth pointing out that in this application the start values should not be arbitrary as the line parameters of the telecom cables are bounded by design requirements. This is somewhat in contrast to the application of Norgren et al. where the target is a more general RLCG filter.

Analytical gradients of the objective function with respect to the parameters can be obtained through (quite) lengthy calculations, see Norgren et al. page 1504, III. An Optimization Approach, A. Explicit Expression for the Gradient for details. The use of analytical gradients allows computational efficient optimization, in contrast to algorithms that employ numerical perturbation. It should however be realized that numerical perturbation can also be used.

According to the invention, the concept of capacitive length is used. This is defined as $$y(x) = \int_0^x C(x', w) dx' = \int_0^x C_\infty(x') dx'. \quad (10)$$

With this definition of the capacitive length, the a priori known total line capacitance can be expressed as $$y(d) = \int_0^d C_\infty(x') dx'. \quad (11)$$

By dividing equation (6) with $C_\infty(y)$ and using equation (10) one obtains $$\frac{d}{dy} r_m(y, w) = 2 \frac{a(y, w)}{C_\infty(y)} r_m(y, w) + \frac{b(y, w)}{C_\infty(y)}(1 + r_m(y, w)^2) \quad (12)$$

By defining $$A(y, w) = \frac{a(y, w)}{C_\infty(y)}$$

and $$B(y, w) = \frac{b(y, w)}{C_\infty(y)},$$

equation (12) can be expressed as $$\frac{d}{dy} r_m(y, w) = 2A(y, w) r_m(y, w) + B(y, w)(1 + r_m(y, w)^2), \quad (13)$$

with the boundary condition (open-ended line)

$$r(y(d), w) = 1 \text{ and where} \quad (14)$$

$$A(y, w) = \frac{1}{2}\left[jw\left(Z_S + \frac{L_\infty(y)}{C_\infty(y)}Z_S^{-1} + \frac{R_v(y)}{C_\infty(y)\sqrt{w}}Z_S^{-1}\right) + \frac{R_v(y)\sqrt{w}}{C_\infty(y)}Z_S^{-1}\right]$$

$$B(y, w) = \frac{1}{2}\left[jw\left(Z_S - \frac{L_\infty(y)}{C_\infty(y)}Z_S^{-1} - \frac{R_v(y)}{C_\infty(y)\sqrt{w}}Z_S^{-1}\right) - \frac{R_v(y)\sqrt{w}}{C_\infty(y)}Z_S^{-1}\right]$$

If the sought parameters are defined as $$p_1(y) = \frac{R_v(y)}{C_\infty(y)} \text{ and } p_2(y) = \frac{L_\infty(y)}{C_\infty(y)},$$

then equation (14) yields $$A(y, w) = \frac{1}{2}\left[jw\left(Z_S + p_2(y)Z_S^{-1} + \frac{p_1(y)}{\sqrt{w}}Z_S^{-1}\right) + p_1(y)\sqrt{w} Z_S^{-1}\right] \quad (15)$$

$$B(x, w) = \frac{1}{2}\left[jw\left(Z_S - p_2(y)Z_S^{-1} - \frac{p_1(y)}{\sqrt{w}}Z_S^{-1}\right) - p_1(y)\sqrt{w} Z_S^{-1}\right]$$

Thus, with the introduction of capacitive length according to equation (10) the number of parameters has been reduced from three to two and the physical length is no longer required.

The parameters $p_1$ and $p_2$ are here the further parameters of a first model M1 of the transmission line, where according to this first model M1, the parameters $R_v(x)$, $L_\infty(x)$, $C_\infty(x)$ and $G_0(x)$ of equation (9), perhaps with the exception of the conductance G, are basic transmission line parameters.

It is (quite) straightforward to solve equation (13) with the help of the boundary condition and equation (11) by means of integration along the negative direction of y(x), i.e., from y(d) to y(0). The implementation details are here omitted.

Note that the expressions for the analytical gradients of the objective function with respect to the parameters are essentially the same as used by Norgren.

By thus using the first model M1, which is an adaption of the simplistic skin effect model used by Norgren, it is possible through the introduction of capacitive length to obtain transmission line parameters of sufficient accuracy in relation to modem data communication. However, the basic parameters of the first model M1 in essence reflect the transmission line properties for higher frequencies in the DSL spectrum. This means that it would be of interest to sometimes use a second model. In the following we describe the usage of one particular cable model, the so-called BT0_H model, However, it should be understood that a similar analysis can straightforwardly be performed with other cable models, such as the VUB0 or the MAR2 cable models.

One such second model, which is a low-order cable model that is valid for both the lower and upper part of the ADSL/VDSL2 spectrum, is described in more detail by F. Lindqvist, P. O. Börjesson, P. Ödling, S. Höst, K. Ericson, and T. Magesacher in "Low-Order and causal twisted-pair cable modeling by means of the Hilbert transform", RVK08—The twentieth Nordic Conference on Radio Science and Communications, Växjö, Sweden, Jun. 9-11, 2008. AIP Conference Proceeding, vol. 1106, pp 301-310, which is herein incorporated by reference.

This model M2 expresses the basic line resistance and inductance as $$R(f) = R_0 \cdot \sqrt[4]{1 + (f/v)^2} = R_0 \cdot Q(f/v) \quad (16)$$

$$L(f) = \frac{R_0}{2\pi f} \cdot \Lambda(f/v) + L_\infty \quad (17)$$

where $R_0$ and $v$ are parameters that control the resistance, and where $\Lambda(f/v)$ is the Hilbert transform of $Q(f/v)$. It is here furthermore possible that $R_0 = r_{oc}$ and $$v = \sqrt{\frac{r_{oc}^4}{a_c}},$$

where r and $a_c$ are parameters described in for instance_ITU-T Recommendation G.996.1.

According to this second model M2, the capacitance is expressed the same way as in equation (9). This means that in this case the basic transmission line parameters are $R_0$, $v$, $L_\infty$ and $C_\infty$.

By using equations (16) and (17), the expressions for $A(y, w)$ and $B(y, w)$ in equation (13) becomes $$A(y, w) = \frac{1}{2}\left[jw\left(Z_S + \frac{L_\infty(y)}{C_\infty(y)}Z_S^{-1}\right) + \frac{R_0(y)}{C_\infty(y)}\left(Q\left(\frac{f}{v(y)}\right) + j\Lambda\left(\frac{f}{v(y)}\right)\right)Z_S^{-1}\right] \quad (18)$$

$$B(y, w) = \frac{1}{2}\left[jw\left(Z_S - \frac{L_\infty(y)}{C_\infty(y)}Z_S^{-1}\right) - \frac{R_0(y)}{C_\infty(y)}\left(Q\left(\frac{f}{v(y)}\right) + j\Lambda\left(\frac{f}{v(y)}\right)\right)Z_S^{-1}\right]$$

If the sought further parameters are defined as $$\tilde{p}_1(y) = \frac{R_0(y)}{C_\infty(y)},$$

$\tilde{p}_2(y) = v(y)$, and $$\tilde{p}_3(y) = \frac{L_\infty(y)}{C_\infty(y)},$$

then equation (18) yields $$A(y, w) = \frac{1}{2}\left[jw(Z_S + \tilde{p}_3(y)Z_S^{-1}) + \tilde{p}_1(y)\left(Q\left(\frac{f}{\tilde{p}_2(y)}\right) + j\Lambda\left(\frac{f}{\tilde{p}_2(y)}\right)\right)Z_S^{-1}\right] \quad (19)$$

$$B(y, w) = \frac{1}{2}\left[jw(Z_S - \tilde{p}_3(y)Z_S^{-1}) - \tilde{p}_1(y)\left(Q\left(\frac{f}{\tilde{p}_2(y)}\right) + j\Lambda\left(\frac{f}{\tilde{p}_2(y)}\right)\right)Z_S^{-1}\right]$$

The solution involves the same basic steps as in when applying the first model M1. The main difference is that the number of parameters is now three and that the Hilbert transform is required. The latter can however be computed with low complexity as described by S. Höst, et. al. in "Low complexity computation of the BT0 Hilbert twisted pair cable model", InOWo10 conference, August 2010, which is herein incorporated by reference.

In this case, analytical expressions for the gradients concerning parameters $\tilde{p}_1$ and $\tilde{p}_2$ are derived in order to utilize the same gradient based optimization. Note that $p_2(y) = \tilde{p}_3(y)$, hence its gradient is already known. The alternative of using small numerical perturbation in place of the analytical gradients would increase the computational complexity significantly. One finds after some calculations (we omit the details):

$$\frac{\partial J}{\partial \tilde{p}_1}(y) = \quad (21)$$

$$\Re \sum_{w=w_{min}}^{w_{max}} Z_S^{-1}\left[Q\left(\frac{f}{\tilde{p}_2(y)}\right) + j\Lambda\left(\frac{f}{\tilde{p}_2(y)}\right)\right]\tilde{p}_1(y)(1 - r_m(y, w))^2 U(y, w)$$

$$\frac{\partial J}{\partial \tilde{p}_2}(y) = \Re \quad (22)$$

$$\sum_{w=w_{min}}^{w_{max}} Z_S^{-1}\left[Q'\left(\frac{f}{\tilde{p}_2(y)}\right) + j\Lambda'\left(\frac{f}{\tilde{p}_2(y)}\right)\right]\tilde{p}_1(y)(1 - r_m(y, w))^2 U(y, w)$$

Where $\Re$ denotes the real part, $U(y, w)$ is a so-called auxiliary function defined by Norgren et al. on page 1504, III. An Optimization Approach, A. Explicit Expression for the Gradient. However here this auxiliary function is expressed as a function of the capacitive length. Note that for the second parameter the gradient includes the derivatives $$Q'\left(\frac{f}{\tilde{p}_2(y)}\right) \equiv \frac{\partial}{\partial v}Q\left(\frac{f}{v(y)}\right)$$

and $$\Lambda'\left(\frac{f}{\tilde{p}_2(y)}\right) \equiv \frac{\partial}{\partial v}\Lambda\left(\frac{f}{v(y)}\right).$$

The first derivative is straightforward as seen by equation (16). The second derivative requires some more thought. It can for instance be calculated by utilizing numerical integration with the variable substitution described by S. Höst, et. al. in "Low complexity computation of the BT0 Hilbert twisted pair cable model, or with less computational complexity by analytically taking the derivative of the polynomial approximation in the same document or similar polynomial.

Each of these two models can be used in the general method described earlier in the first embodiment of the invention.

Figure 6:
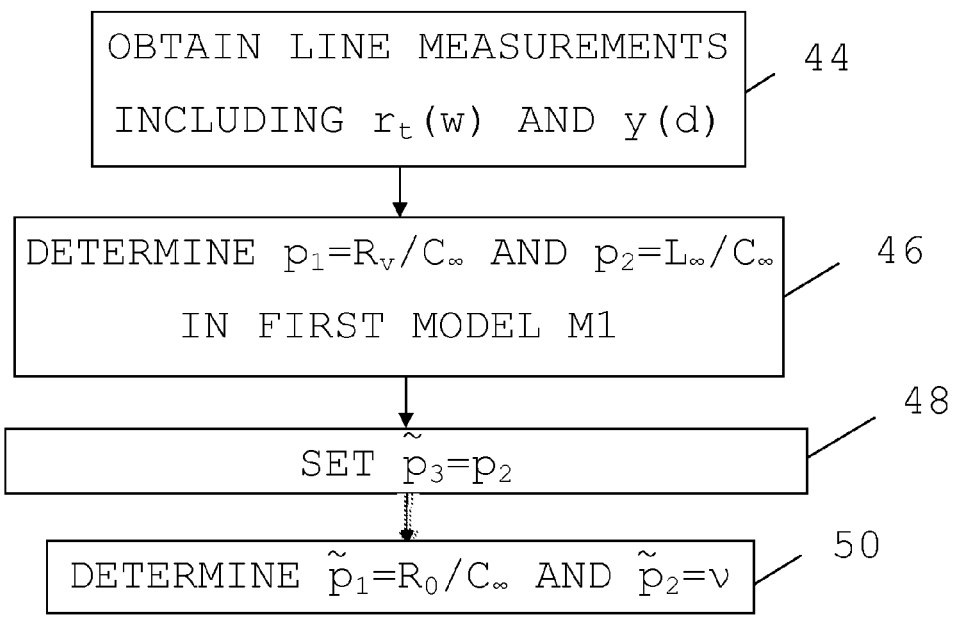
FIG. 6 shows a flow chart of a method for determining the parameters in two models of a transmission line according to a second embodiment of the invention.

However they may also be used in a combined way as described in the following, with reference being made to FIG. 6, which shows a flow chart of a method for determining the parameters in two models of a transmission line according to a second embodiment of the invention and to FIG. 7, which shows a flow chart of the details of determining parameters in a model according to the second embodiment. The method according to the second embodiment of the invention is being performed in the DSLAM 10.

According to the second embodiment of the invention, the measurement obtaining unit 26 obtains measurements of the line comprising total line capacitance y(d) and reflection coefficient defining data, here in the form of a measured true reflection coefficients $r_t(w)$, step 44.

These are forwarded to the parameter determining unit 28, which goes on and determines the parameters $p_1 = R_v/C_\infty$ and $p_2 = L_\infty/C_\infty$ of the first model M1, step 46, which parameters are combinations of the basic transmission line parameters $R_v$, $L_\infty$ and $C_\infty$.

More particularly these parameters are determined through these model parameters first being initialized in the parameter determining unit 28 according to their start values, step 52, i.e. start values are set for the parameters $p_1$ and $p_2$.

These parameters are here relatively few and not as many as are needed, therefore the parameter determining unit 28 is also configured to join the points of the parameters to each other according to a point interconnecting scheme, step 54. How this interconnection may be performed will be discussed in more detail later.

The model of the reflection coefficient is then estimated, step 56, by the reflection coefficient estimating unit 29 using a differential equation based on the basic transmission line parameters of the first transmission line model M1 and here using equation (13). The basic transmission line parameters are here the parameters defined in equation (9). Furthermore, in this differential equation the capacitive length is also used. Here the total line capacitance is furthermore used as part of a boundary condition, which boundary condition is also based on the assumption of an open-ended line.

Thereafter the estimated reflection coefficients $r_m(0, w)$ and the true reflection coefficients $r_t(0, w)$ are applied by the objective function handling unit 30 in an objective function $J(p)$, step 58. This function has the same structure as is shown in equation (4).

Thereafter the minimising unit 32 minimises the objective function $J(p)$ by using analytical gradients of the objective function with regard to the further parameters in the first transmission line model M1, which is done through calculating analytical gradients with respect to the model parameters, step 60. In this example this is done with respect to the further model parameters $p_1(y)$ and $p_2(y)$ of the first model M1. This means that the minimising unit 32 minimises the objective function $J(p)$ using $dJ/dp_1$ and $dJ/dp_2$.

As the minimisations are made with regard to the further parameters $p_1$ and $p_2$ of the first model M1 it is clear that the capacitive length $y(x)$ is also employed in these analytical gradients.

When this has been done the parameters are updated by the parameter determining unit 28 via gradients according to a suitable optimization scheme, step 62. The optimization scheme may here be based on e.g. a conjugate gradient algorithm or a Quasi-Newton algorithm.

The parameter determining unit 28 then investigate if the objective function $J(p)$ is sufficiently minimised, which may be done through comparing the value of the objective function with a threshold TH. If the threshold TH is exceeded, step 64, then steps 54-62 are repeated. In this way minimisations are iteratively repeated until the desirable parameters are obtained with a sufficient accuracy. If however the value of the objective function is below the threshold, step 64, then the last parameter values are set, by the parameter determining unit 28, to be the final parameter values, step 66. In the case of the first model M1, the parameter determining unit 28 thus determines the sought parameters $p_1(y)=R_v(y)/C_\infty(y)$ and $p_2(y)=L_\infty(y)/C_\infty(y)$, which parameters are combinations of the basic transmission line parameters $R_v$, $L_\infty$ and $C_\infty$.

However, in order to improve the determining of parameters, this is in the second embodiment combined with also using the second model M2.

Since the second further parameter of the first model is equal to the third further parameter of the second model, i.e. $p_2(y)=\tilde{p}_3(y)$, also the second model M2 can be applied while only optimizing two further parameters. In this case it is possible to exclude lower frequencies from the objective function when using the first model M1. The found value of $p_2(y)$ is now possible to use as a fixed value for $\tilde{p}_3(y)$ resulting in only two parameters to be optimized with the low frequency model M2. Alternatively, the found value of $p_2(y)$ may be used as start value for $\tilde{p}_3(y)$ when optimizing all three parameters.

In this second embodiment the second parameter $p_2(y)$ of the first model is used as a fixed value of the third parameter $\tilde{p}_3(y)$ of the second model M2. Therefore the parameter determining unit 28 here first sets the third further parameter $\tilde{p}_3(y)$ of the second model M2 equal to the second further parameter $p_2$ of the first model M1, step 48, in order to reduce the number of calculations and the dimension of the optimisation problem.

Figure 7:
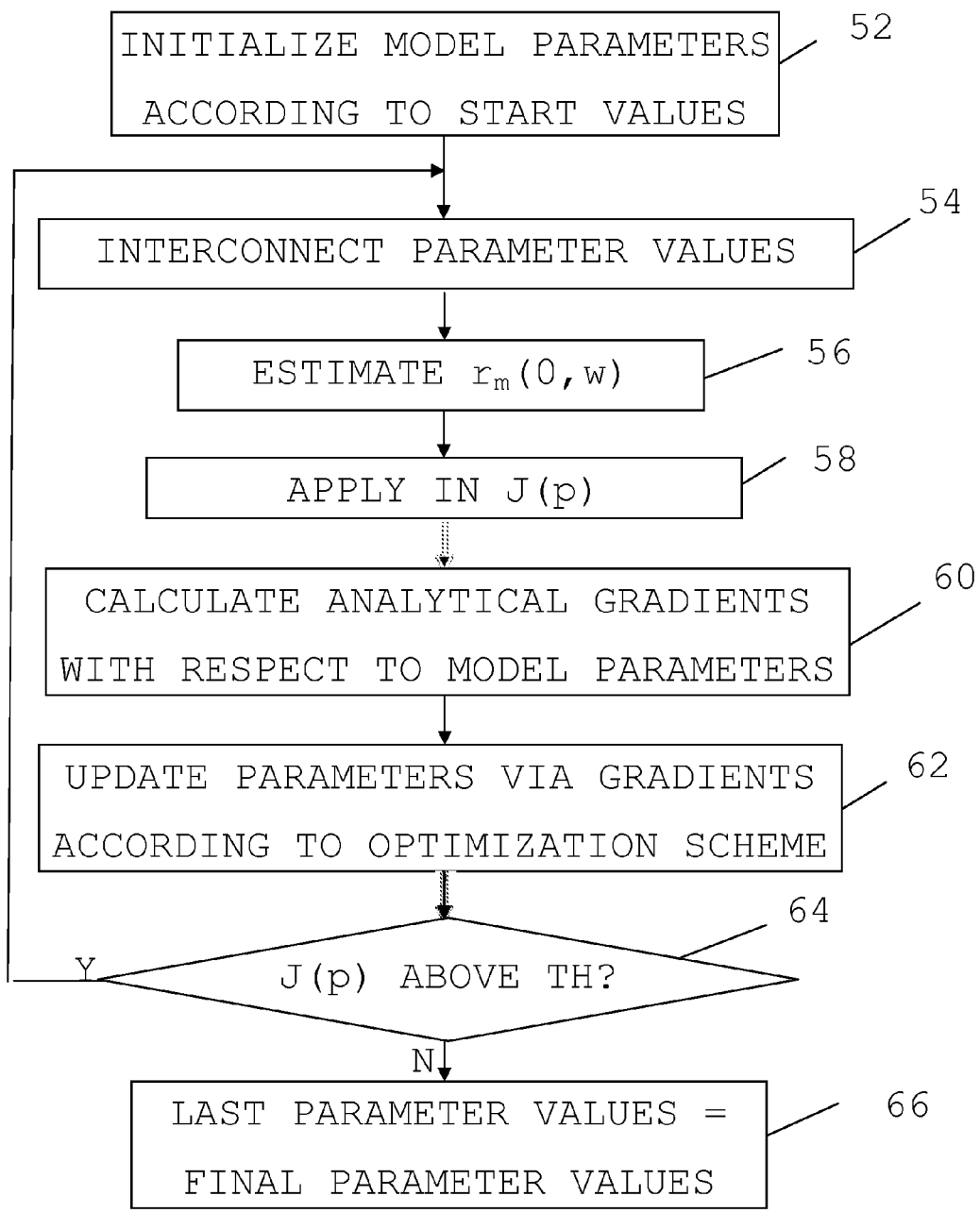
FIG. 7 shows a flow chart of the details of determining parameters in a model according to the second embodiment.

For this second model M2 parameter determination is performed in the same way as in the first model, i.e. according to steps 52-66 of FIG. 7. Therefore the parameter determining unit performs initialization of model parameter, step 52, and interconnection of parameter values. The reflection coefficient estimating unit 29 again estimates the model of the reflection coefficient using a differential equation based on basic transmission line parameters, step 56. However, in this case the basic resistive and inductive transmission line parameters comprise the parameters as set out in equations (16) and (17), while the basic capacitive parameter is as set out in equation (9). Thus, the basic resistive transmission line parameters are in this case the parameters $R_0(y)$ and $v(y)$, while the basic inductive transmission line parameter is $L_\infty(y)$ and the basic capacitive transmission line parameter is $C_\infty(y)$. The estimated model parameter is then applied in the objective function by the objective function handling unit 30, step 58. This is then followed by minimisations by the minimising unit 32. The minimising unit 32 here calculates analytical gradients with respect to the second model M2, step 60, i.e. with respect to $\tilde{p}_1$ and $\tilde{p}_2$, which is followed by updating of the parameters via gradients according to the optimization scheme, step 62. These steps are then repeated iteratively until the further parameters of the second model with a sufficient accuracy have been obtained by the parameter determining unit 28, i.e. until the value of the objective function falls below the threshold TH. The parameter determining unit 28 thus determines the parameters $$\tilde{p}_1(y) = \frac{R_0(y)}{C_\infty(y)}$$

and $\tilde{p}_2(y)=v(y)$ step 50. When performing these activities the reflection coefficient estimating unit 29 and the minimising unit 32 both employ the capacitive length and where appropriate also the total line capacitance.

The parameters are here typically determined for frequencies below 1 MHZ and with advantage for frequencies typically in the range of 20 kHz-5000 kHz.

As promised above, there will now be discussion about the interconnection of parameter values that was performed in the previously described iterative minimization. The parameters defining the transmission line are determined as discrete values at equidistant points in a spatial dimension of the line. This situation is schematically shown in FIG. 7, which shows the further parameter $p_2$ of the first model in relation to the spatial variable x which is the variable in the length direction of the transmission line where there is a true parameter value $p_{2TRUE}$ and an estimated parameter value $p_{2EST}$. The transmission line is in this case a spliced cable, which makes a jump or displays a step change from a first level to a second level at the position of this splice in the dimension of the spatial variable x. In the figure it can be seen that the estimations are made at a number of discrete points, where four around the step change $p_2(a)$, $p_2(b)$, $p_2(c)$ and $p_2(d)$ are shown.

The number of points of the parameter that is needed may be high. It may for example be desirable to have 2000-5000 points in the dimension x. However, the number of computations needed for obtaining so many points using the first and the second models may be very high if gradients are calculated for all these parameters, which adds to the computations costs and decreases computational speed. This means that in order to reduce the number of computations, optimization may only be made on a subset of these desirable points, for instance on 2-50 parameter values. The other parameter values can be interconnected by spatial modelling described in the following. This also has the benefit of reducing the dimension of the optimisation problem.

Another observation that can be made in FIG. 7 is that the parameters become more difficult to estimate near the far-end at high values of x. However, this error has a minor impact on for example the transfer function estimation for a wide frequency range.

In order to obtain the additional parameter values that are required, the parameter determining unit 28 is configured to join the points of the estimated parameters to each other according to a point interconnecting scheme. The additional parameter values may then be obtained as points on a curve formed in this way, which additional points are thus provided in-between estimated points.

This joining can be made in a number of ways. In this second embodiment the joining is made using spatial linear interpolation.

Alternative ways to join the points are through using piecewise-constant spatial modelling and spatial modelling with an orthonormal basis functions. In this latter case it is also possible to use analytical gradients for the coefficients associated with the orthogonal/orthonormal basis function.

In this latter caser each point may be connected via orthogonal/orthonormal basis function, for example a Fourier series, according to $$p_n(y) = \sum_{j=0}^{K-1} a_{nj}\psi_j(y) \qquad (23)$$

where $\psi_j(y)$ is the j:th basis function, and $a_{nj}$ is the j:th coefficient associated with the n:th model parameter. Moreover, for this case analytical gradients with regard to $a_{nj}$ can (straightforwardly) be obtained and with advantage employed in the minimisation.

The joining of points was above described in relation to the second further parameter of the first model M1. The same scheme can of course be applied also on the first further parameter of the first model as well as on the first, second and third further parameter of the second model M2.

It can generally be considered to be applied on a parameter $p_i$, where i=1 or 2 in the first model M1 and 1, 2 or 3 in the second model M2.

The parameters determined in the above described way may then be used for a number of different purposes.

They are for instance of interest when studying changes of line state and potential errors. More particularly, they may be used in determining a number of interesting properties of the transmission line like capacity in the form of bit rate.

Figure 8:
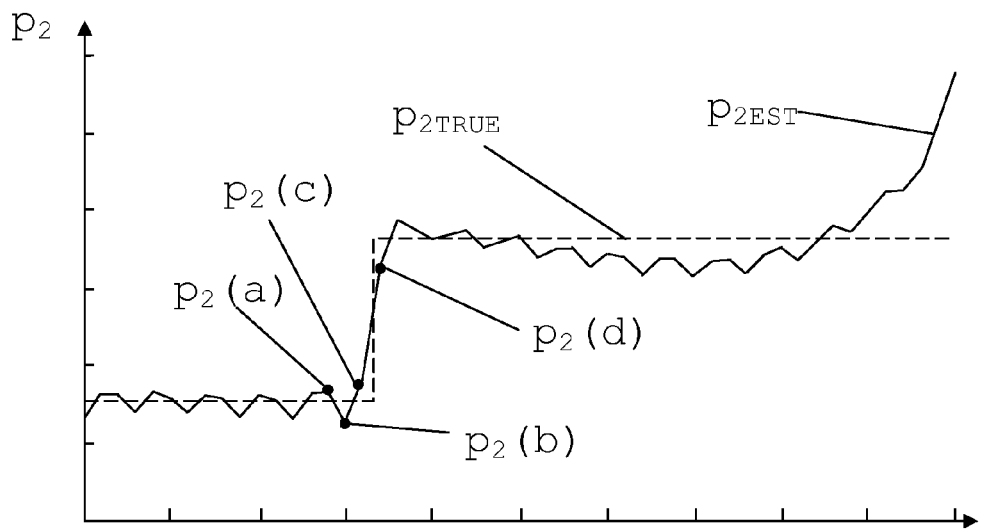
FIG. 8 shows a plotting of an estimated parameter in a model of a transmission line compared with a corresponding true parameter along a spatial dimension of the transmission line, FIG. 9 schematically shows a number of method step for determining the capacity of a transmission line, and FIG. 10 schematically shows a computer program product in the form of a CD ROM disc with a computer program performing the functionality of the invention when being loaded into a parameter determining device.

The determining of the capacity may be performed by the capacity determining unit 34 of the DSLAM 10 according to the method steps disclosed in FIG. 8.

The line measurements used could here be the input impedance with e.g. an open-end or short-circuit termination. With an assumed source impedance of for instance 100Ω the true physical reflection coefficient can be obtained and used in the determining of parameters. However, based on these parameters also the transfer function H is determined, step 68.

The transfer function is typically $$H = e^{-jwp_0\sqrt{p_2+\frac{p_1}{jw}}} \qquad (24)$$

where $p_0$ is the capacitive length.

The capacity determining unit 34 then obtains total noise data of the line via the communication interface 22 in the form of noise measurements from the transmission line, step 70. Thereafter the capacity of the line is determined based on the transfer function and the noise data, step 72.

For DSL transmission the capacity is normally calculated as the sum of the maximum number of bits per subcarrier that can be transmitted for a given error rate.

The determined capacity may then be used in the determining of the maximum amount of data allowed to be transferred to and from the DSL modem.

The invention has several advantages.

It does not require any knowledge of the physical length of the transmission line, which may otherwise be difficult to obtain.

The capacitive length can be practically measured by e.g. traditional POTS line cards or DSL modems.

Through the use of the capacitive length the number of parameters in the optimization problem is reduced. This has several further advantages. The number of computations are reduced and thus the processing effort. It also reduces the dimension of the optimization problem and reduces the risk of finding a local optimum.

The described improvements for lower frequencies improves the estimated line parameters of the lower part of the DSL-spectrum.

Figure 9:
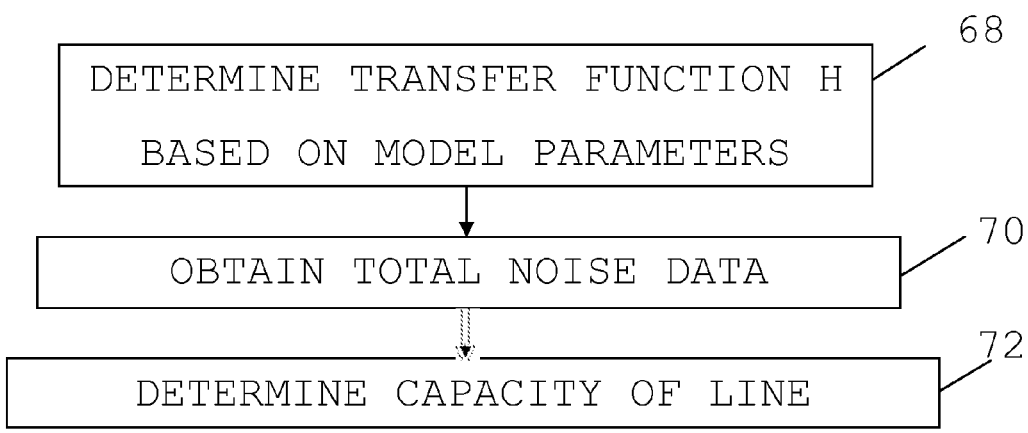
Figure 10:
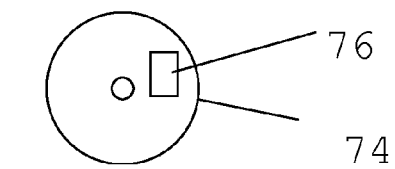

The parameter determining module and its units may with advantage be provided in the form of a processor with associated program memory including computer program code or a set of instructions for performing the functionality of the parameter determining module. It should be realized that this module may also be provided in the form of hardware, like for instance in the form of an Application Specific Integrated Circuit (ASIC) or a Digital Signal Processor (DSP). The computer program code may also be provided on a computer-readable means, for instance in the form of a data carrier or computer readable storage medium, like a CD ROM disc or a memory stick, which will implement the function of the above-described parameter determining module when being loaded into the above-mentioned program memory and run by the processor. One such computer program product in the form of a CD ROM disc 74 with such a computer program code 76 is schematically shown in FIG. 9.

Therefore, while the invention has been described in connection with what is presently considered to be most practical and preferred embodiments, it is to be understood that the invention is not to be limited to the disclosed embodiments and variations, but on the contrary, is intended to cover various modifications and equivalent arrangements. Therefore the invention is only to be limited by the following claims.

The invention claimed is:

1. A method, executed in a parameter determining module of a device connected to one end of a transmission line and providing access to a data communication network, for determining transmission line parameters in a model of the transmission line, comprising basic transmission line parameters comprising a basic resistive transmission line parameter, a basic capacitive transmission line parameter and a basic inductive transmission line parameter, the method comprising:
- obtaining measurements of the transmission line comprising reflection coefficient defining data and a total line capacitance;
- introducing a capacitive length as the capacitance integrated along the whole length of the transmission line;
- estimating a model value of the reflection coefficient using a differential equation that is based on the basic transmission line parameters and the capacitive length;
- applying, in an objective function for the transmission line, true reflection coefficients obtained through the reflection coefficient defining data, the objective function comprising a sum of error signals, each error signal comprising a difference between the model value of the reflection coefficient and a corresponding true reflection coefficient;
- minimizing the objective function by utilizing gradients of the objective function with respect to the transmission line parameters to be determined and employing the capacitive length; and
- determining at least two transmission line parameters as combinations of the basic transmission line parameters in the transmission line model.

2. The method of claim 1, wherein the total line capacitance is part of a boundary condition in the differential equation.

3. The method of claim 1, wherein:
- a first transmission line parameter comprises the basic resistive transmission line parameter divided by the basic capacitive transmission line parameter; and
- a second transmission line parameter comprises the basic inductive transmission line parameter divided by the basic capacitive transmission line parameter.

4. The method of claim 1, wherein the reflection coefficient defining data comprises impedance measurements, the method further comprising determining the true reflection coefficients based on the impedance measurements.

5. The method of claim 1, wherein the reflection coefficient defining data comprises the true reflection coefficients.

6. The method of claim 1, wherein the transmission line model comprises a low-frequency model valid for a wider bandwidth including the lower frequencies.

7. The method of claim 1, wherein the transmission line model comprises a first high-frequency transmission line model with associated basic resistive, capacitive, and inductive transmission line parameters.

8. The method of claim 7, further comprising:
- calculating gradients of the minimized objective function with respect to further parameters of a second low-frequency transmission line model; and
- determining at least three further transmission line parameters as combinations of second basic transmission line parameters of the second low-frequency transmission line model;
- wherein the second basic transmission line parameters comprise a second basic resistive transmission line parameter, a second basic capacitive transmission line parameter, and a second basic inductive transmission line parameter; and
- wherein at least one of the at least three further transmission line parameters can be derived from one of the at least two transmission line parameters obtained via the transmission line model.

9. The method of claim 8, wherein a second transmission line parameter obtained via the transmission line model is used as a fixed value of one of the at least three further transmission line parameters obtained via the second low-frequency transmission line model.

10. The method of claim 8, wherein a second transmission line parameter obtained using the transmission line model is used as start value for obtaining one of the at least three further transmission line parameters in the second low-frequency transmission line model.

11. The method of claim 1, wherein the gradients comprise analytical gradients.

12. The method of claim 1, wherein the gradients comprise numerical gradients.

13. The method of claim 1, wherein the transmission line comprises an open ended line.

14. The method of claim 1, wherein the transmission line parameters are determined as discrete values at equidistant points in a spatial dimension of the line, the method further comprising interconnecting the points using an interconnecting scheme.

15. The method of claim 14, wherein the interconnecting scheme uses partial linear interpolation.

16. The method of claim 14, wherein the interconnecting scheme uses piecewise-constant spatial modeling.

17. The method of claim 14, wherein the interconnecting scheme uses spatial linear interpolation.

18. The method of claim 14, wherein the interconnecting scheme uses spatial modeling with an orthogonal/orthonormal basis functions.

19. The method of claim 18, wherein the spatial modeling comprises using analytical gradients for the coefficients associated with the orthogonal/orthonormal basis functions.

20. The method of claim 1, further comprising determining the transmission capacity of the transmission line based on the determined transmission line parameters.

21. A device for determining transmission line parameters in a model of a transmission line, comprising basic transmission line parameters comprising a basic resistive transmission line parameter, a basic capacitive transmission line parameter and a basic inductive transmission line parameter, the device comprising a parameter determining module configured to introduce a capacitive length as the capacitance integrated along the whole length of the transmission line, the parameter determining module further comprising:
- a measurement obtaining processing circuit configured to obtain measurements of the transmission line comprising reflection coefficient defining data and a total line capacitance;
- a reflection coefficient estimating unit configured to estimate a model value of the reflection coefficient using a differential equation that is based on the basic transmission line parameters and the capacitive length;
- an objective function handling processing circuit configured to apply, in an objective function for the transmission line, true reflection coefficients obtained through the reflection coefficient defining data, the objective comprising a sum of error signals, each error signal comprising a difference between the model value of the reflection coefficient and a corresponding true reflection coefficient;
- a minimizing processing circuit configured to minimize the objective function by utilizing gradients of the objective function with regard to the model parameters to be determined and employing the capacitive length; and a parameter determining processing circuit configured to determine at least two transmission line parameters as combinations of the basic transmission line parameters in the transmission line model.

22. A computer program product for determining transmission line parameters in a model of a transmission line, comprising basic transmission line parameters comprising a basic resistive transmission line parameter, a basic capacitive transmission line parameter and a basic inductive transmission line parameter, the computer program product stored in a non-transitory computer readable storage medium comprising a set of instructions, which when executed by a parameter determining module of a parameter determining device connected to one end of the transmission line and providing access to a data communication network, causes the parameter determining module to:

obtain measurements of the transmission line at least comprising reflection coefficient defining data and a total line capacitance;

introduce a capacitive length as the capacitance integrated along the whole length of the transmission line;

estimate a model value of the reflection coefficient using a differential equation that is based on the basic transmission line parameters and the capacitive length;

apply true reflection coefficients obtained through the reflection coefficient defining data in an objective function for the transmission line, the objective function comprising a sum of error signals, each error signal comprising a difference between the model value of the reflection coefficient and a corresponding true reflection coefficient;

minimize the objective function by utilizing gradients of the objective function with respect to the model parameters to be determined and employing the capacitive length; and determine at least two transmission line parameters as combinations of the basic transmission line parameters in the transmission line model.

* * * * *